United States Patent
Lee

[11] Patent Number: 5,898,007
[45] Date of Patent: Apr. 27, 1999

[54] METHOD FOR FORMING WELLS OF A SEMICONDUCTOR DEVICE

[75] Inventor: Kil Ho Lee, Kyoungki-do, Rep. of Korea

[73] Assignee: Hyundai Electronics Industries Co., Ltd., Kyoungki-do, Rep. of Korea

[21] Appl. No.: 08/769,751

[22] Filed: Dec. 20, 1996

[30] Foreign Application Priority Data

Dec. 29, 1995 [KR] Rep. of Korea .................. 95-66051

[51] Int. Cl.$^6$ ........................................ H01L 21/425
[52] U.S. Cl. .................................. 438/514; 438/527
[58] Field of Search .................................. 438/514, 510, 438/527, 529, 530

[56] References Cited

U.S. PATENT DOCUMENTS

| | | | |
|---|---|---|---|
| 4,992,841 | 2/1991 | Halvis | 357/24 |
| 5,235,197 | 8/1993 | Chamberlain et al. | 257/230 |
| 5,573,963 | 11/1996 | Sung | 437/34 |
| 5,661,046 | 8/1997 | Ilderem et al. | 438/202 |
| 5,741,731 | 4/1998 | Yuuki | 438/132 |

Primary Examiner—Joni Chang
Attorney, Agent, or Firm—Gary M. Nath; Nath & Associates

[57] ABSTRACT

A method for forming wells of a semiconductor device which involves the formation of an additional ion implanted layer and a double rapid thermal annealing for a short period of time, thereby completely removing defects while maintaining a constant resistance in the silicon layer of the semiconductor device. The method includes the steps of providing a semiconductor substrate, sequentially implanting impurity ions in the semiconductor substrate four times, thereby sequentially forming an ion implanted layer adapted to form a well, an additional ion implanted layer, a channel stop ion implanted layer and an ion implanted layer adapted to control a threshold voltage in the semiconductor substrate, and conducting a rapid thermal annealing for the resulting structure for a short period of time in two steps.

18 Claims, 2 Drawing Sheets

METHOD FOR FORMING WELLS OF A SEMICONDUCTOR DEVICE

BACKGROUND OF THE INVENTION

1. Field of the Invention

The present invention relates to a method for fabricating semiconductor devices, and more particularly to a method for forming wells of a semiconductor device which are proper for the high integration of a semiconductor device.

2. Description of the Prior Art

Referring to FIG. 1, a conventional method for forming profiled wells of a semiconductor device is illustrated. FIG. 1 is a sectional view explaining the conventional well forming method. Incontrast, FIG. 2 is a graph depicting an impurity ion concentration distribution depending on a well depth in the structure of FIG. 1.

In accordance with the conventional method, an element-isolating film 2 is formed over a semiconductor substrate 1, as shown in FIG. 1. Using a high energy ion implanting device, a well ion implanted layer 3, a channel stop ion implanted layer 4 and a threshold voltage ion implanted layer 5 are then sequentially formed in the semiconductor substrate 1.

After the formation of the implanted layers, vacancy dot defects (not shown) are distributed in a portion of the semiconductor substrate 1 extending up to about 0.8 Rp from the surface of the semiconductor substrate 1. Here, "Rp" means a projected range determined by ion implantation energy. Interstitial dot defects are also distributed in a portion of the semiconductor substrate 1 ranging from 1 to 2 Rp.

Thereafter, the resulting structure is annealed in a furnace, which is maintained at a temperature of about 900 to 1,000° C. for about one hour, thereby electrically activating the dopants. Thus, a profiled well is formed.

In contrast, FIG. 2 shows an impurity ion concentration distribution and defect distribution in the semiconductor substrate depending on the depth of the semiconductor substrate. In FIG. 2, the curve 11 depicts an impurity ion concentration distribution in the well, the curve 12 depicts an impurity ion concentration distribution upon the channel stop ion implantation. The curve 13 depicts an impurity ion concentration distribution in the ion implantation for a threshold voltage control. The curve 14 depicts an interstitial dot defect distribution. The curve 15 depicts a vacancy dot defect distribution.

Referring to FIG. 2, the channel step ion implanted region and the ion implanted region for forming the well have a large space differential in accordance with the conventional method. As a result, the dot defects existing in the interstitial dot defect layer formed upon the channel step ion implantation can not be coupled with the dot defects existing in the vacancy dot defect layer formed upon the ion implantation for forming the well when a subsequent thermal annealing is carried out. As a result, such dot defects are left after the subsequent thermal annealing. Furthermore, an increase in resistance occurs because no dopant exists between the two ion implanted layers.

In order to eliminate the above-mentioned defects, a thermal annealing should be conducted at a high temperature for a long time. However, in this case, diffusion of dopants occurs, thereby resulting in a variation in the ion concentration distribution. Consequently, a degradation in the characteristic of the well occurs.

As is apparent from the above description, the conventional well forming method involves a degradation in the electrical characteristic of the semiconductor device which is eventually produced. This results in the degraded reliability of the semiconductor device. Consequently, the conventional method is improper for the high integration of semiconductor devices.

SUMMARY OF THE INVENTION

Therefore, an object of the invention is to eliminate the above-mentioned problems involved in the conventional method and to provide a method for forming wells of a semiconductor device which can remove the defects while maintaining a constant resistance in the silicon layer of the semiconductor device.

Another object of the invention is to provide a method for forming wells of a semiconductor device which is capable of not only reducing the processing time but also improving the electrical characteristics and reliability of the semiconductor device.

Another object of the invention is to provide a method for forming wells of a semiconductor device which is proper for the high integration of the semiconductor device.

In accordance with one aspect of the present invention, a method for forming a well of a semiconductor device comprises the steps of: providing a semiconductor substrate; sequentially implanting impurity ions in the semiconductor substrate, thereby sequentially forming a first ion implanted layer, a second ion implanted layer, a third ion implanted layer and a fourth ion implanted layer in the semiconductor substrate; and conducting a rapid thermal annealing for the resulting structure for a short period of time.

In accordance with another aspect of the present invention, a method for forming a well of a semiconductor device comprises the steps of: providing a semiconductor substrate; sequentially implanting impurity ions in the semiconductor substrate four times, thereby sequentially forming an ion implanted layer adapted to form a well, an additional ion implanted layer, a channel stop ion implanted layer and an ion implanted layer adapted to control a threshold voltage in the semiconductor substrate; and conducting a rapid thermal annealing for the resulting structure for a short period of time in two steps.

BRIEF DESCRIPTION OF THE DRAWINGS

Other objects and aspects of the invention will become apparent from the following description of embodiments with reference to the accompanying drawings in which:

FIG. 1 is a sectional view explaining a conventional method for forming profiled wells of a semiconductor device;

DETAILED DESCRIPTION OF THE PREFERRED EMBODIMENTS

Figure 1:
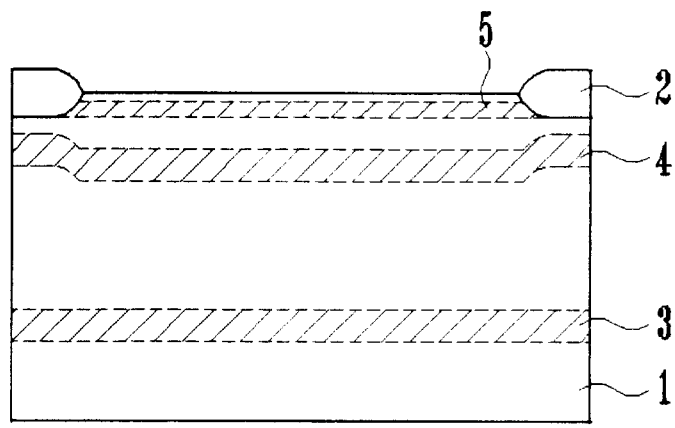
FIG. 1 illustrated a conventional method for forming profiled wells of a semiconductor device.
Figure 2:
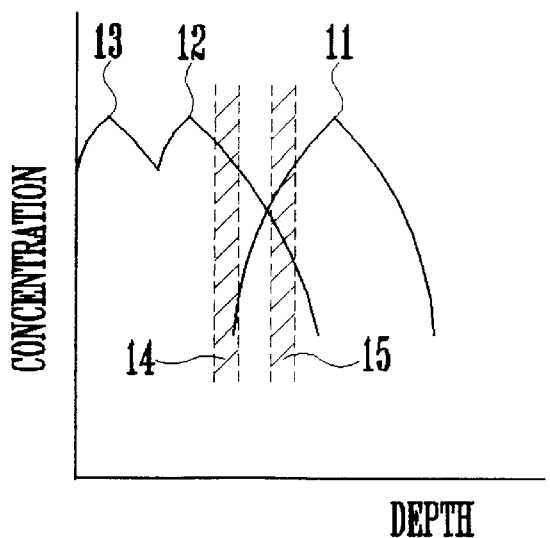
FIG. 2 is a graph depicting an impurity ion concentration distribution depending on the well depth in the structure of FIG. 1.
Figure 3:
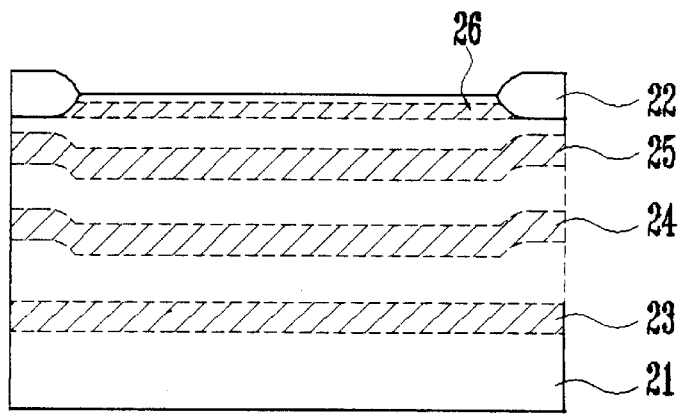
FIG. 3 is a sectional view explaining a method for forming wells of a semiconductor device in accordance with the present invention.
Figure 4:
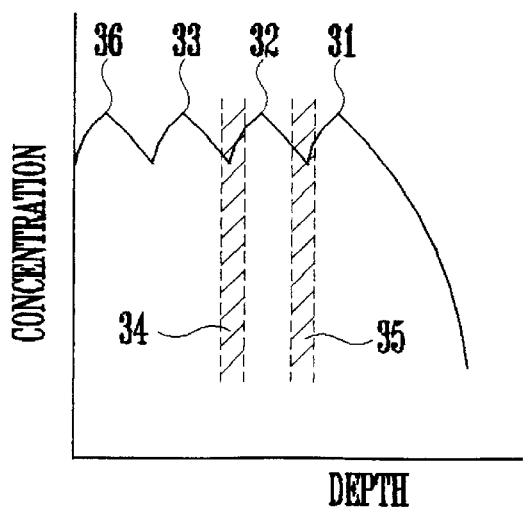
FIG. 4 is a graph depicting an impurity ion concentration distribution depending on a well depth in the structure of FIG. 3.

FIG. 3 is a sectional view explaining a method for forming wells of a semiconductor device in accordance with the present invention. On the other hand, FIG. 4 is a graph depicting an impurity ion concentration distribution depending on the well depth in the structure of FIG. 3.

In accordance with the present invention, an element-isolating insulating film 22 is formed over a semiconductor substrate 21, as shown in FIG. 3. Thereafter, a primary boron ion implantation is conducted. That is, boron ions are implanted in the semiconductor substrate 21, thereby forming a first ion implanted layer 23 which is to be used for the formation of a well. The primary boron ion implantation is carried out using ion energy of about 500 and 600 KeV and a dose of $1 \times 10^{13}$ to $5 \times 10^{13}/cm^2$ even though such a condition is determined in accordance with a design rule as used.

Subsequently, a secondary boron ion implantation is conducted. That is, boron ions are implanted in the semiconductor substrate 21, thereby forming a second ion implanted layer 24. The secondary boron ion implantation is carried out using ion energy corresponding to about 0.5 times the ion energy used in the primary boron ion implantation or about 2 times the ion energy used in a subsequent ion implantation for forming a channel stop. On the other hand, the dose of boron ions used in the secondary boron ion implantation is the same as that in the primary boron ion implantation.

Thereafter, third and fourth boron ion implantation steps are conducted. At the third boron ion implantation step, boron ions are implanted in the semiconductor substrate 21, thereby forming a third ion implanted layer 25 which forms a channel stop. On the other hand, at the fourth boron ion implantation step, boron ions are implanted in the semiconductor substrate 21, thereby forming a fourth ion implanted layer 26 which serves to control a threshold voltage.

A boron ion concentration distribution in the silicon of the semiconductor substrate 21 obtained by the above-mentioned multistep boron ion implantation is illustrated in FIG. 4.

As shown in FIG. 4, the second ion implanted layer 24 is additionally interposed between the first ion implanted layer 23 for the formation of a well and the third ion implanted layer 25 for the formation of a channel stop. By virtue of the second ion implanted layer 24, it is possible to reduce the resistance exhibited between the first and third ion implanted layers 23 and 25.

In accordance with the method of the present invention, it is possible to form a region 34 in which both the interstitial dot defects produced upon the formation of the third ion implanted layer 25 for forming a channel stop and the vacancy dot defects produced upon the additional formation of the second ion implanted layer 24 exist. It is also possible to form a region 35 in which both the interstitial dot defects produced upon the formation of the additional formation of the second ion implanted layer 24 and the vacancy dot defects produced upon the formation of the first ion implanted layer 23 for forming a well exist.

Using a rapid thermal annealing device, the resulting structure is then primarily annealed at a temperature of about 850 to 950° C. in a nitrogen atmosphere for about 10 seconds. Since the primary rapid thermal annealing is conducted at a relatively low temperature for a short period of time, the dopants are not electrically activated. Rather, the interstitial dot defects and vacancy dot defects existing in the regions 34 and 35 are coupled to each other. Accordingly, these defects are removed.

Subsequently, a secondary rapid thermal annealing is conducted at a temperature of about 950 to 1,000° C. in a nitrogen atmosphere for 10 seconds or less, thereby electrically activating the dopants.

Although the method of the present invention has been described in conjunction with a profiled p-well, it is also applied to the formation of a profiled n-well. In this case, the p-well is shielded by a photoresist film. Also, n-type impurity ions such as phosphorous ions are used.

As is apparent from the above description, the method for forming wells of a semiconductor device in accordance with the present invention have various effects.

That is, the method of the present invention involves the formation of an additional ion implanted layer interposed between a channel stop ion implanted layer and a well ion implanted layer and a double rapid thermal annealing for a short period of time. Accordingly, it is possible to completely remove defects while maintaining a constant resistance along the depth of the semiconductor substrate.

In accordance with the present invention, it is also possible to suppress a diffusion of dopants because the rapid thermal annealing is conducted. Accordingly, the characteristic of the profiled well can be maintained.

Therefore, it is possible to reduce the processing time, thereby achieving an improvement in the productivity and yield of semiconductor devices. In addition, an improvement in the electrical characteristics of the semiconductor devices is obtained, thereby improving the reliability of the semiconductor devices. Thus, the high integration of semiconductor devices is possible.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a well of a semiconductor device comprising the steps of:

providing a semiconductor substrate;

first, implanting impurity ions into the semiconductor substrate to form a first ion implanted layer in a lower portion of the semiconductor substrate;

second, implanting impurity ions into the semiconductor substrate to form a second ion implanted layer on top of the first ion implanted layer for reducing a resistance exhibited between the first ion implanted layer and a third ion implanted layer which is formed in the next step;

third, implanting impurity ions into the semiconductor substrate to form the third ion implanted layer act as a channel stop on top of the second ion implanted layer;

fourth, implanting impurity ions into the semiconductor substrate to form a fourth ion implanted layer on top of the third ion implanted layer; and conducting in two steps a rapid thermal annealing at two different temperature ranges for the resulting structure from the previous steps.

2. The method in accordance with claim 1, wherein the impurity ions are p-type impurity ions.

3. The method in accordance with claim 2, wherein the p-type impurity ions are boron ions.

4. The method in accordance with claim 1, wherein the impurity ions are n-type impurity ions.

5. The method in accordance with claim 4, wherein the n-type impurity ions are phosphorous ions.

6. The method in accordance with claim 1, wherein the first ion implanted layer is used as an ion implanted layer for forming a well.

7. The method in accordance with claim 1, wherein the third ion implanted layer is used as a channel stop ion implanted layer.

8. The method in accordance with claim 1, wherein the fourth ion implanted layer is used as an ion implanted layer for controlling a threshold voltage.

9. The method in accordance with claim 1, wherein the step of forming the first ion implanted layer is conducted using an ion energy of 500 and 600 KeV and a dose of $1\times10^{13}$ to $5\times10^{13}/cm^2$.

10. The method in accordance with claim 1, wherein the step of forming the second ion implanted layer is conducted using an ion energy corresponding to about 0.5 times the ion energy used at the step of forming the first ion implanted layer.

11. The method in accordance with claim 1, wherein the step of forming the second ion implanted layer is conducted using an ion energy corresponding to about 2 times the ion energy used at the step of forming the third ion implanted layer.

12. The method in accordance with claim 1, wherein the primary step of the rapid thermal annealing is carried out at a temperature of about 850 to 950° C. in a nitrogen atmosphere for about 1 to 10 seconds.

13. The method in accordance with claim 1, wherein the secondary step of the rapid thermal annealing is carried out at a temperature of about 950 to 1,000° C. in a nitrogen atmosphere for about 1 to 10 seconds.

14. A method for forming a well of a semiconductor device comprising the steps of:

providing a semiconductor substrate;

first, implanting impurity ions into the semiconductor substrate to form a first ion implanted layer for forming a well in a lower portion of the semiconductor substrate;

second, implanting impurity ions into the semiconductor substrate to form an additional ion implanted layer on top of the first ion implanted layer for reducing a resistance between the first ion implanted layer and a channel stop ion implanted layer which is formed at the next step;

third, implanting impurity ions into the semiconductor substrate to form the channel stop ion implanted layer on top of the additional ion implanted layer;

fourth, implanting impurity ions into the semiconductor substrate to form a second ion implanted layer on top of the channel stop ion implanted layer, wherein the second ion implanted layer is adapted to control a threshold voltage in the semiconductor substrate; and conducting in two steps a rapid thermal annealing at two different temperature ranges for the resulting structures from the previous steps.

15. (Amended) The method in accordance with claim 14, wherein the step of forming the first ion implanted layer for the formation of a well is conducted using an ion energy of 500 and 600 KeV and a dose of $1\times10^{13}$ to $5\times10^{13}/cm^2$.

16. The method in accordance with claim 15, wherein the step of forming the additional ion implanted layer is conducted using an ion energy corresponding to about 0.5 times the ion energy used at the step of forming the first ion implanted layer for the formation of a well or an ion energy corresponding to about 2 times the ion energy used at the step of forming the channel stop ion implanted layer.

17. The method in accordance with claim 14, wherein the primary step of the rapid thermal annealing is carried out at a temperature of about 850 to 950° C. in a nitrogen atmosphere for about 1 to 10 seconds while the secondary step of the rapid thermal annealing is carried out at a temperature of about 950 to 1,000° C. in a nitrogen atmosphere for about 1 to 10 seconds.

18. A method for forming a well of a semiconductor device comprising the steps of:

providing a semiconductor substrate;

first, implanting impurity ions into the semiconductor substrate to form a first ion implanted layer for forming a well in a lower portion of the semiconductor substrate wherein the step of first implanting impurity ions is conducted using an ion energy of 500 and 600 KeV and a dose of $1\times10^{13}$ to $5\times10^{13}/cm^2$;

second, implanting impurity ions into the semiconductor substrate to form an additional ion implanted layer on top of the first ion implanted layer for reducing a resistance between the first ion implanted layer and a channel stop ion implanted layer which is formed at the next step, wherein the step of second implanting impurity ions is conducted using an ion energy corresponding to 0.5 times the ion energy used at the step of first implanting impurity ions;

third, implanting impurity ions into the semiconductor substrate to form a channel stop ion implanted layer on to of the additional ion implanted layer;

fourth, implanting impurity ions into the semiconductor substrate to form a second ion implanted layer, which is adapted to control a threshold voltage in the semiconductor substrate, on top of the channel stop implanted layer; and conducting in two steps a rapid thermal annealing for the resulting structure from the previous steps, wherein the primary step of the rapid thermal annealing is carried out at a temperature of 850 to 950°C. in a nitrogen atmosphere for 1 to 10 seconds and the secondary step of the rapid thermal annealing is carried out at a temperature of 950 to 1000° C. in a nitrogen atmosphere for 1 to 10 seconds.

* * * * *

UNITED STATES PATENT AND TRADEMARK OFFICE
CERTIFICATE OF CORRECTION

PATENT NO. : 5,898,007
DATED : April 27, 1999
INVENTOR(S) : Kil Ho Lee

It is certified that error appears in the above-identified patent and that said Letters Patent is hereby corrected as shown below:

Claim 14, Column 5, Line 52, replace "structures" with

--structure--

Claim 15, Column 5, Line 54, delete "(Amended)".

Claim 18, Column 6, Line 39, replace "to" with --top--.

Signed and Sealed this

Fourteenth Day of September, 1999

Attest:

Q. TODD DICKINSON

*Attesting Officer*  *Acting Commissioner of Patents and Trademarks*